United States Patent [19]

Targetti

[11] Patent Number: 5,779,354
[45] Date of Patent: Jul. 14, 1998

[54] MODULAR SUPPORT STRUCTURE FOR ELECTRICAL AND ELECTRONIC DEVICES AND FOR LIGHTING APPARATUSES

[76] Inventor: Paolo Targetti, 29, Via Barbacane, 50100 Florence, Italy

[21] Appl. No.: 753,934

[22] Filed: Dec. 3, 1996

[30] Foreign Application Priority Data

Dec. 20, 1995 [IT] Italy ................... FI95A0256

[51] Int. Cl.$^6$ ................................ F21V 21/00
[52] U.S. Cl. .................. 362/362; 312/107; 312/223.5
[58] Field of Search ................. 312/223.1, 223.5, 312/108, 107, 265.1, 265.4, 213, 245, 111; 362/227, 249, 252, 362; D9/418, 430; D6/449, 478, 475; 220/23.83; 52/28, 79.4, 79.9

[56] References Cited

U.S. PATENT DOCUMENTS 2,559,249  7/1951  Hudson ................... 52/28 X
5,360,264  11/1994  Crane .................. 312/204 X

FOREIGN PATENT DOCUMENTS 0653327  5/1995  European Pat. Off. .
2417957  9/1979  France .

*Primary Examiner*—Peter M. Cuomo
*Assistant Examiner*—Janet M. Wilkins
*Attorney, Agent, or Firm*—Browdy and Neimark

[57] ABSTRACT

A modular support structure for lighting apparatuses, as well as other electrical and electronic devices and their relative instrumentation, comprising a plurality of modular elements (1) having a box-like form with an open main face (2), through which the devices are visible, as well as a series of consecutive faces (6,7,8) which are angled in succession and form connection surfaces for adjacent modular elements. Modular element (1) preferably comprises a first pair of faces (6) orthogonal to the main face, a second pair of faces (7) consecutive with the first pair of faces and angled with respect to them and a third face (8) which unites the two faces of the second pair and is substantially parallel to the main face. Preferably, the faces of the first and second pairs (6,7) form an angle of about 150° whereas the faces of the second pair (7) are angled by about 120° with the third face (8). The resulting structure is adaptable to a large number of applications, is self-supporting and makes it possible to realize structures of various forms and arrangements for the support of apparatuses.

20 Claims, 9 Drawing Sheets

MODULAR SUPPORT STRUCTURE FOR ELECTRICAL AND ELECTRONIC DEVICES AND FOR LIGHTING APPARATUSES

DESCRIPTION

1. Field of the Invention

The present invention relates to a modular support structure for electrical and electronic devices and in particular, but not exclusively, lighting apparatuses and their relative instrumentation.

2. Description of the Prior Art

The problem of mounting electronic devices, and in particular lighting apparatuses and their instrumentation, on walls, on suspended supports, on poles or on the ceiling has been resolved for specific cases with particular supports dedicated or specially designed for each particular application. However, each such support, because of its specificity, has the inconvenience of being difficult, if not impossible, to use for applications different from the ones for which it was originally designed.

The object of the present invention is to provide a modular support structure that is adaptable to a large number of applications, is self-supporting and makes it possible to realize compositions of various forms and arrangements.

A further object of the present invention is to provide a modular support element which makes it possible to easily obtain said structure and which is suited to hold both lighting apparatuses and other electrical and electronic devices along with their relative instrumentation.

SUMMARY OF THE INVENTION

These and other objects are accomplished by the modular support structure according to the invention characterized by the fact that it comprises a plurality of modular elements having a box-like form and an open main face through which said devices are visible as well as a series of consecutive faces angled in succession which form connection surfaces for adjacent modular elements.

The modular support element has, therefore, a main face and, preferably, five consecutive faces to which adjacent modular elements can be connected.

Advantageously, the modular element has a prismatic form and the connection faces comprise a first pair of faces orthogonal to the main face, a second pair of faces consecutive with the first pair of faces and angled with respect to them as well as a third face which unites the two faces of the second pair and is substantially parallel to the main face.

According to a particularly preferred embodiment, the faces of the first and second pair are angled by about 150° whereas the second pair of faces and the third face are angled by 120°.

BRIEF DESCRIPTION OF THE DRAWINGS

Further characteristics and advantages of the modular support structure and the relative modular element according to the present invention will become more apparent in the following description of some of its possible embodiments, given as examples and not limitative, with reference to the attached drawings in which.

DESCRIPTION OF THE PREFERRED EMBODIMENT

Figure 1:
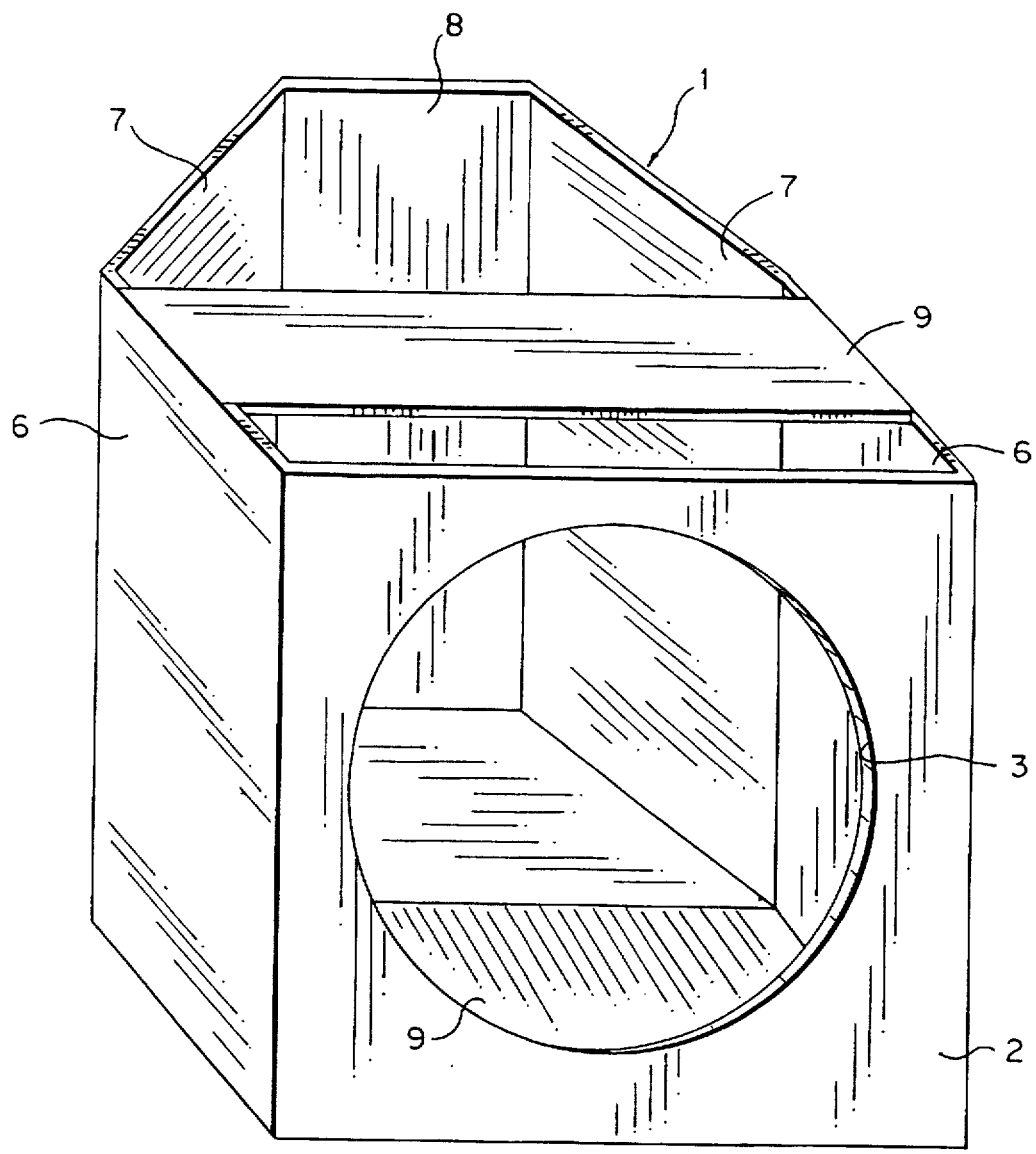
FIG. 1 is a perspective view of a modular support element according to the present invention.

With reference to FIG. 1, a modular support element according to the present invention, for lighting apparatuses and their relative instrumentation, is generically indicated by 1. It is of a prismatic, box-like form and has a main face 2 with an opening 3, in particular of circular shape, through which a lighting apparatus 4 is accessible, as shown in FIGS. 2 to 6. The lighting apparatus can, for example, be of the type described in EP-A-0736729 or of any other suitable type.

For example, the spotlight 5 and light socket 6 of EP '729 are disposed inside a mobile support 2 which includes a plate 3 and an ogival wall 4. (An "ogive" is a pointed or Gothic arch.) The mobile support is hinged to the fixed support 1 by a rotatable connection 7, as recited in the Abstract of EP '729. The figures of EP '729 are "sectional" views (3;10), and show the lamp 5 and socket 6 inside the ogival wall.

The plate 3 and ogival wall 4 are similar to the structure shown in instant FIGS. 3–7, except that the lamp and socket inside the ogival wall are not shown in the instant figures, which are not sectional views. The spotlight 5 of EP '729 is a wave-emitting device, and the mobile support 2 is a means for mounting the spotlight.

The modular support element 1 further comprises five connection faces consecutively extending from one side of main face 2 to the opposite side of the same. More precisely, the connection faces comprise a first pair of faces 6 that are orthogonal to main face 2 and parallel to one another, a second pair of faces 7 that are consecutive with first pair 6 and angled obliquely with respect to them, and a third face 8 which unites the two faces of second pair 7 and is substantially parallel and behind main face 2.

In FIG. 1, two parallel stiffening faces 9 are shown for uniting parallel faces 6.

Figure 2:
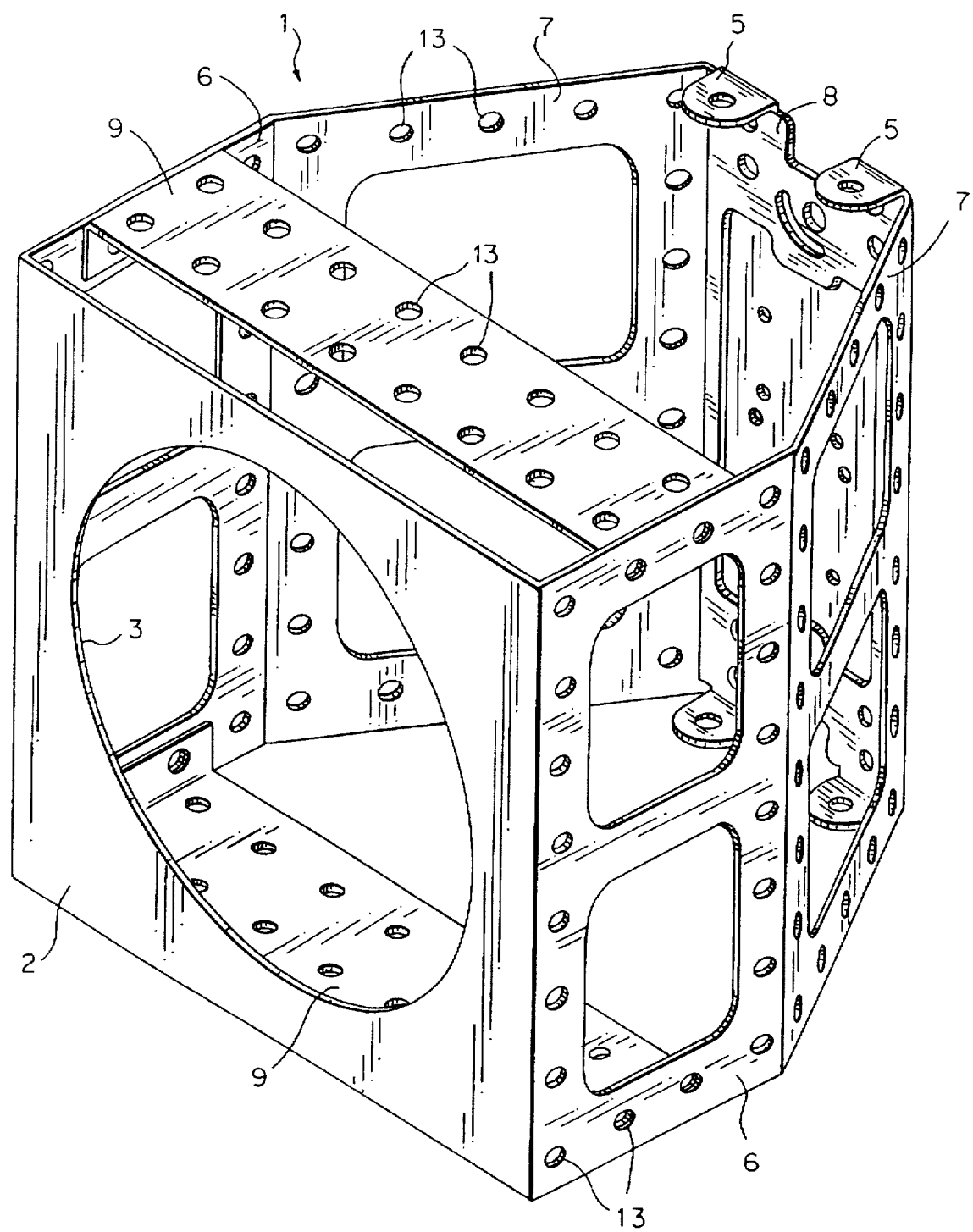
FIG. 2 is a perspective view of a preferred embodiment of the modular support element of FIG. 1.

According to one particularly preferred solution, as illustrated in FIG. 2, the faces of first pair 6 and those of second pair 7 are angled with respect to one another by about 150°, whereas the faces of second pair 7 and third face 8 are angled with respect to one another by about 120°. Furthermore, faces 6, 7, 8 and 9 have windows to make the structure lighter and/or holes or perforations 13 for connection to adjacent elements, as well as auxiliary perforated tabs 5 for connections to be made between stiffening faces 9. The connection holes 13 of joined faces may accept through-fasteners, such as screws, joining the faces of two elements 1.

Many support structures can be realized with the modular element of FIG. 1, and their forms vary according to the number of elements, the way the elements are arranged and the connection faces chosen for the combination with adjacent modular elements.

Figure 3:
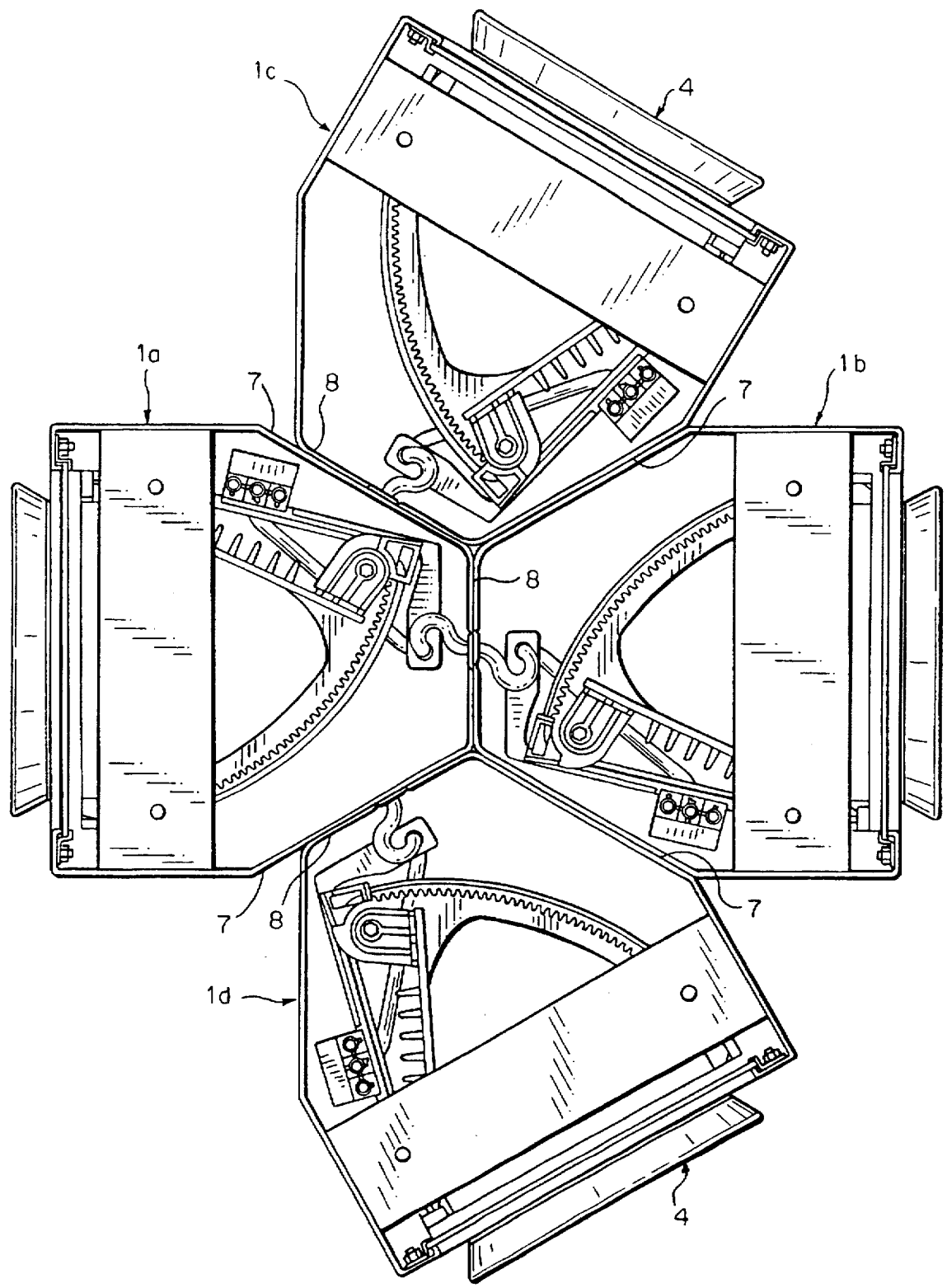
FIGS. 3 through 7 show a top plan view of, modular support structures for lighting apparatuses composed of, respectively, four elements in a closed, compact form, four elements paired off and facing away from each other in a closed form, four elements in an open form, three elements in a compact form, and six elements arranged a hexagonal pattern.

As can be seen in FIG. 3, starting with four modular elements 1a, 1b, 1c and 1d, a compact structure can be obtained by placing elements 1a and 1b back to back and connecting them by their central rear faces 8. The other elements 1c and 1d are each connected by their rear face 8 to element 1a and by one of their oblique faces 7 to element 1b.

Figure 4:
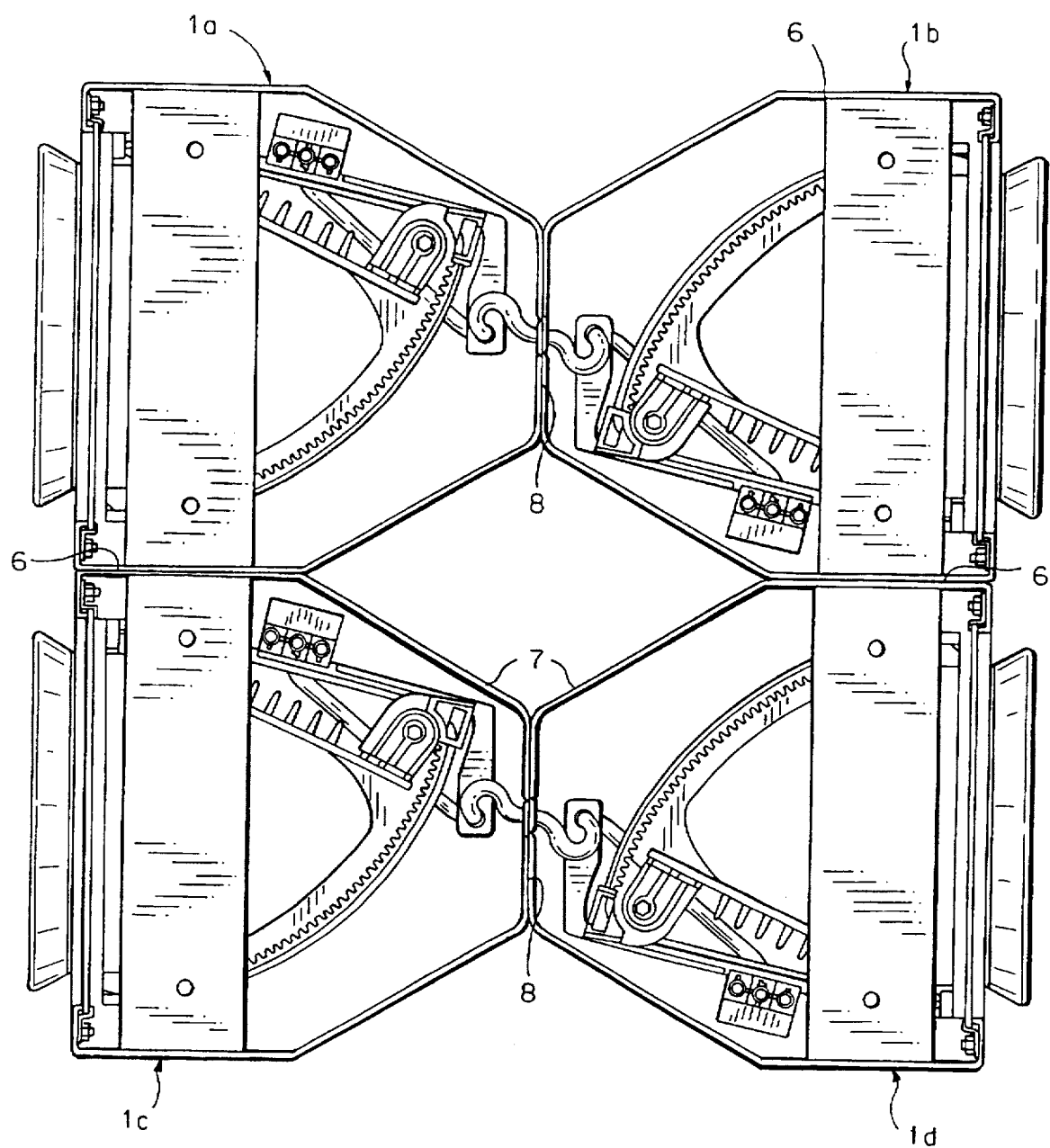

With reference to FIG. 4, according to one variation in the mounting of the elements, placing elements 1c and 1d back to back and elements 1a and 1b, also back to back, next to them, the two pairs of elements can be connected by means of one of their parallel faces 6, forming a substantially quadrilateral structure.

Figure 5:
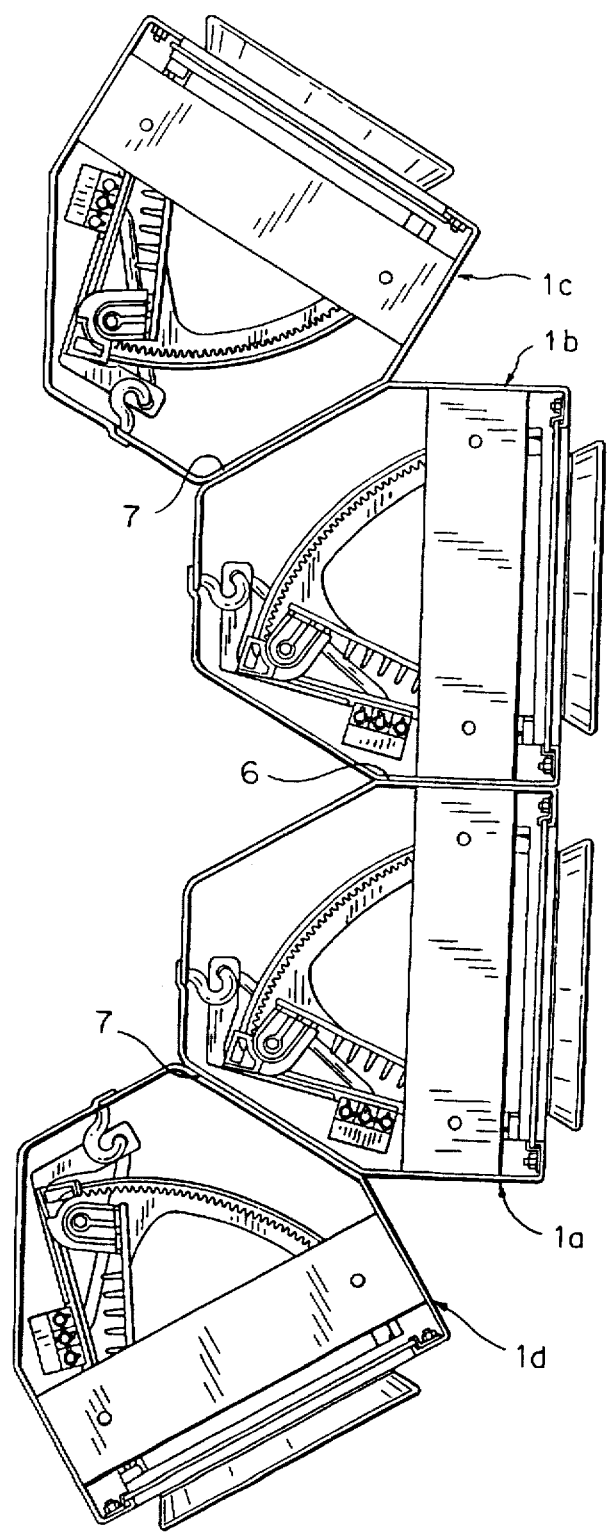
Figure 6:
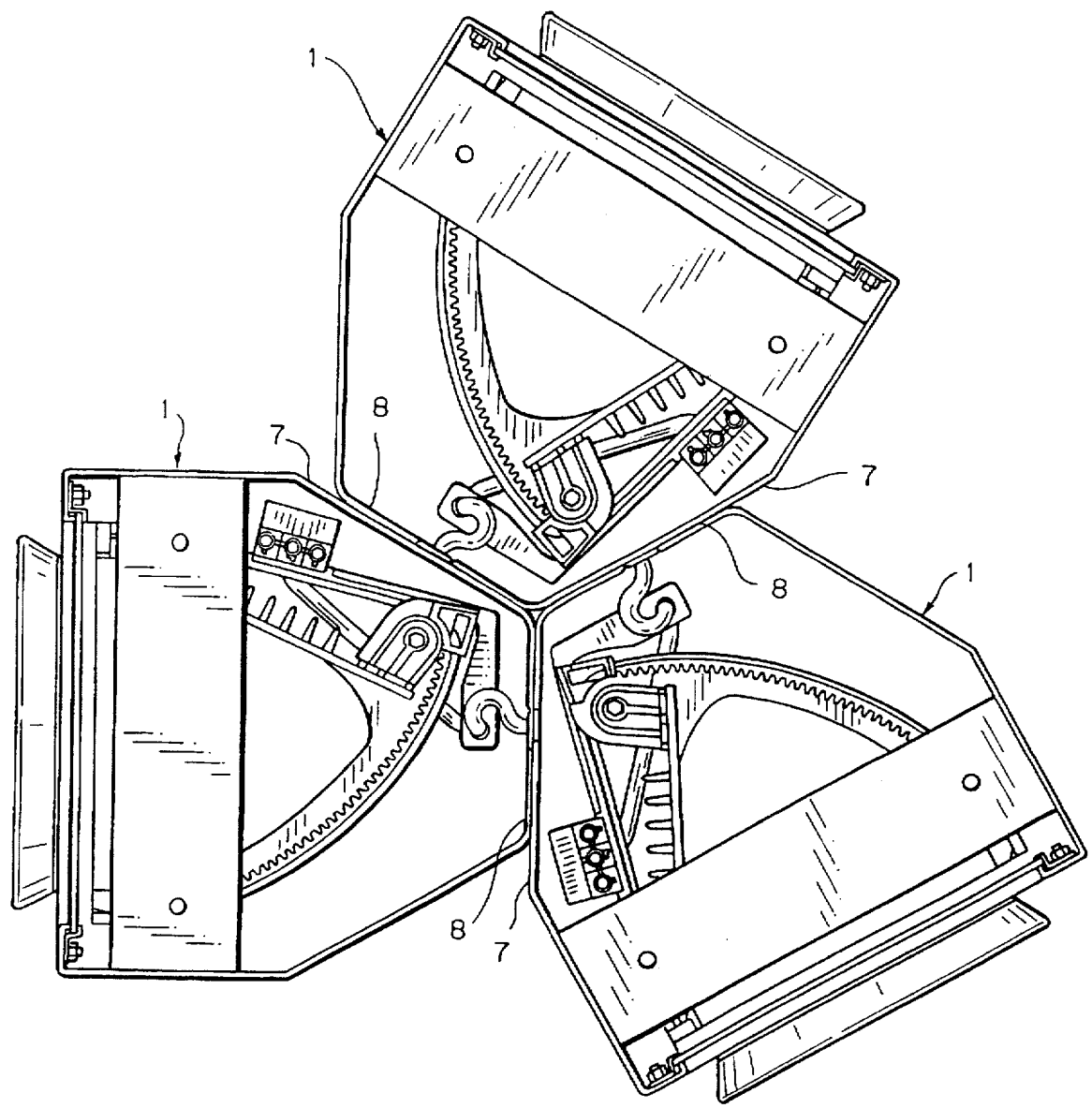

By connecting, on the other hand, elements 1a and 1b together by their parallel faces 6, as shown in FIG. 5, and the other elements 1c and 1d to them by means of their oblique faces 7, an open, semicircular structure can be obtained.

A compact, triangular structure (FIG. 6) can be obtained with three elements 1 by connecting rear face 8 and one of the oblique face 7 and, respectively, rear face 8 of the other two elements.

Figure 7:
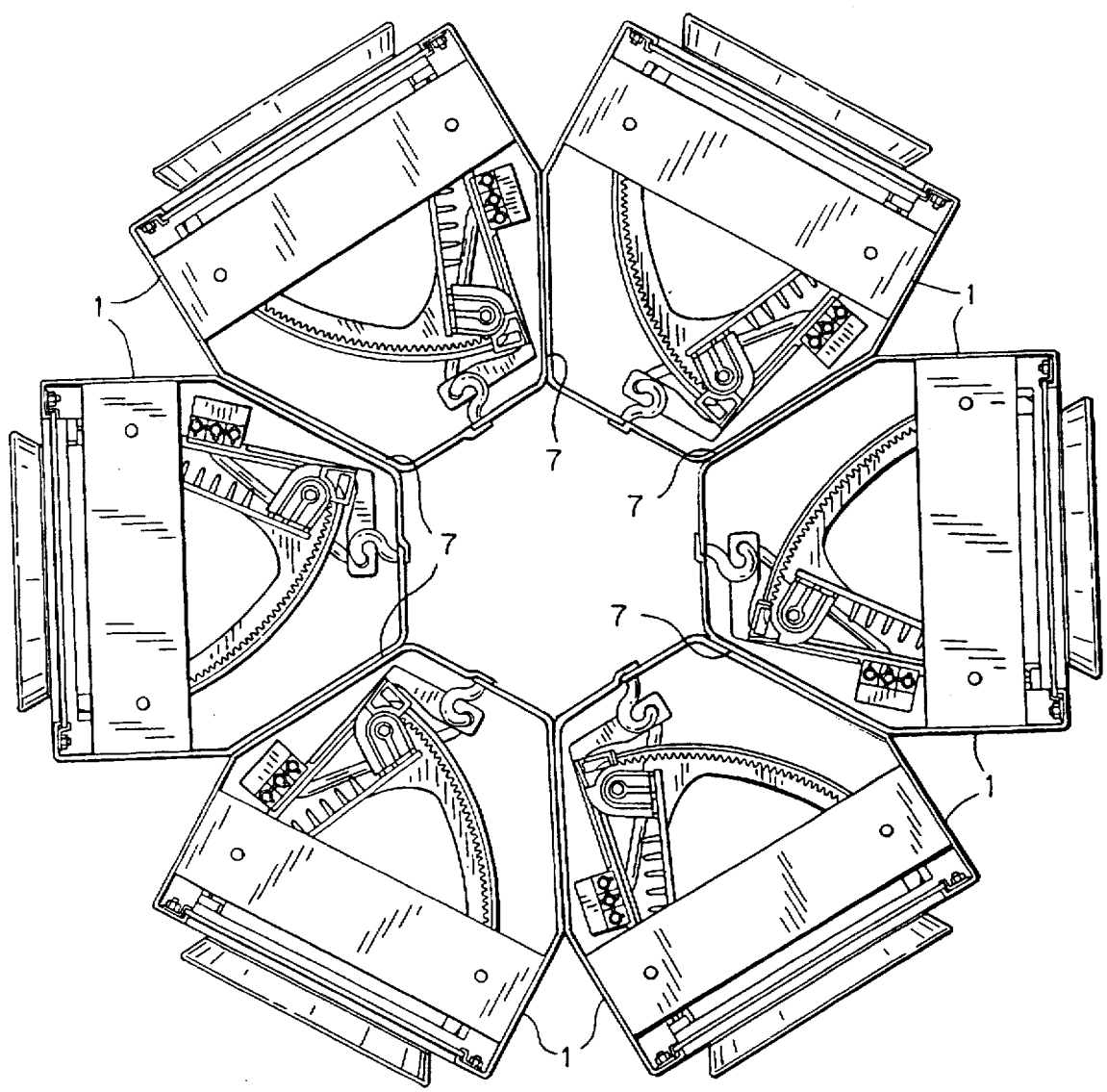

Furthermore, by connecting six consecutive elements by means of their oblique faces 7 only, it is possible to obtain a hexagonal ring structure, as shown in FIG. 7. Clearly, in addition to the structures illustrated here, many other possible structures are not described for the sake of simplicity, but are obvious to technicians in the field who use the modular elements according to the present invention. Moreover, by varying the angles between faces 6, 7 and 8, other geometric combinations, and in particular octagonal and dodecagonal annular combinations, etc., are possible.

It should be pointed out that, besides containing lighting apparatuses such as the one illustrated as an example, the modular elements 1 can contain other electronic devices, for example instrumentation for lamps such as power supply device, transformers, lighting devices, or, alternatively, loudspeakers, alarm systems, smoke detection systems and other fire-safety systems. Lights and loudspeakers emit waves, either electromagnetic or acoustic.

Figure 8:
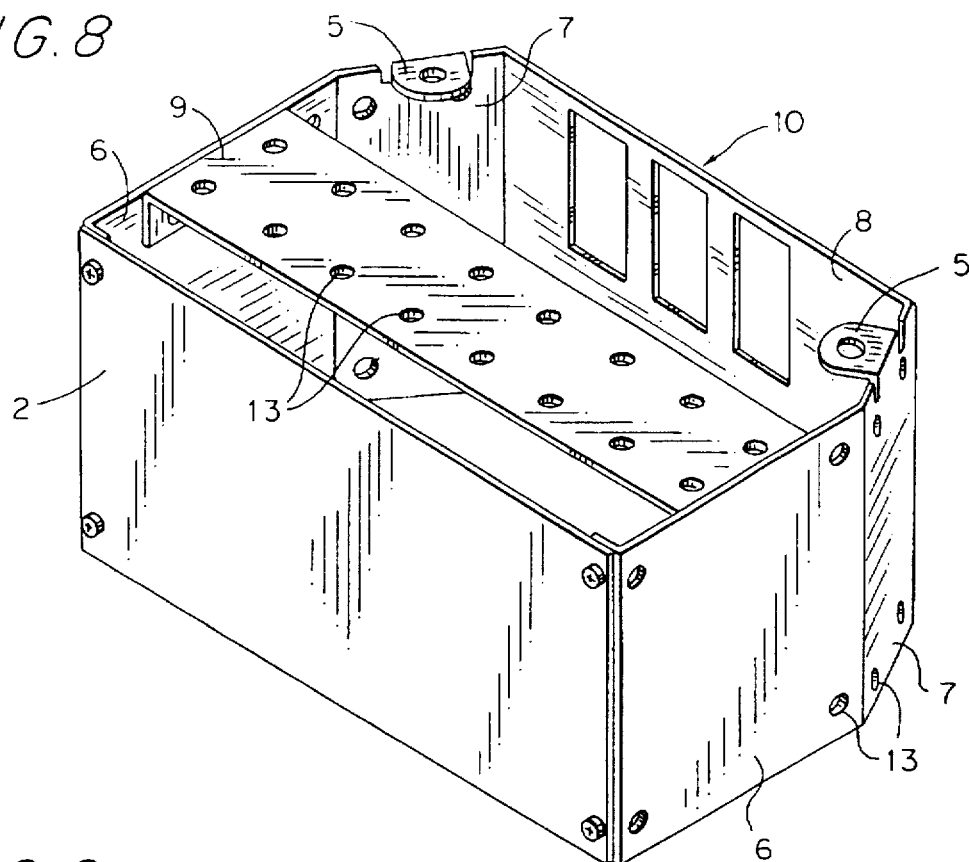
FIGS. 8 and 9 show a perspective view of two further embodiments of modular support elements according to the invention.
Figure 9:
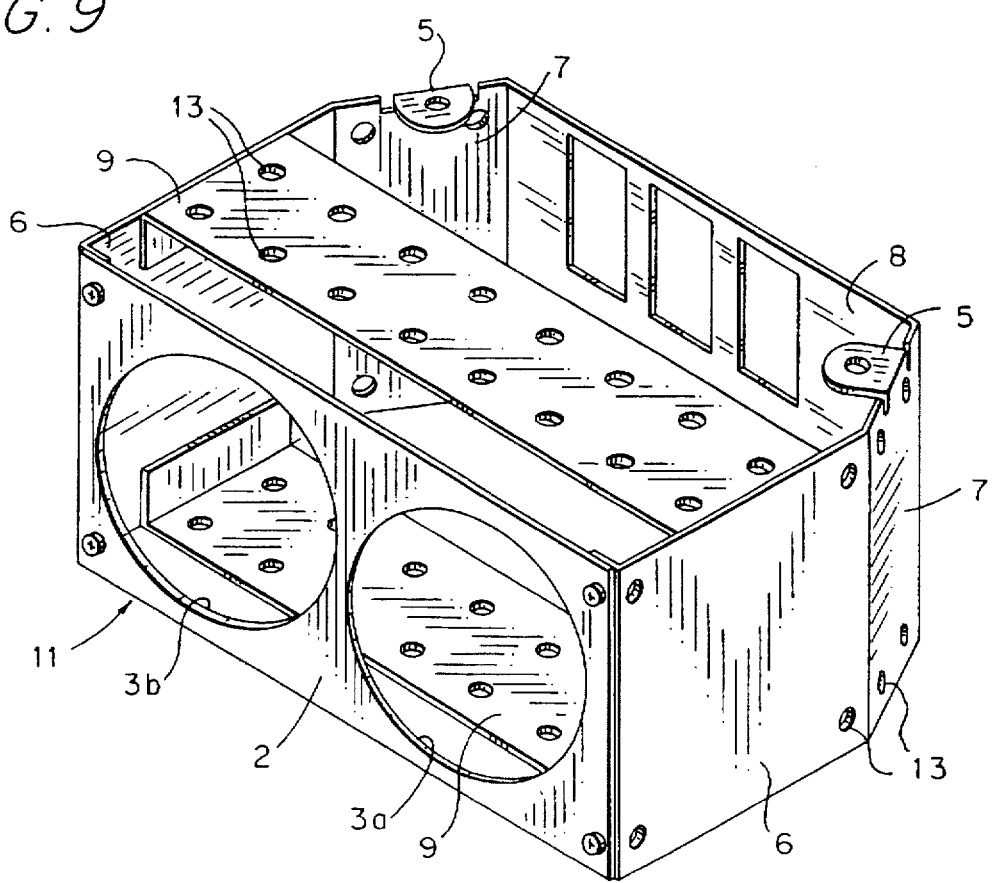
Figure 10:
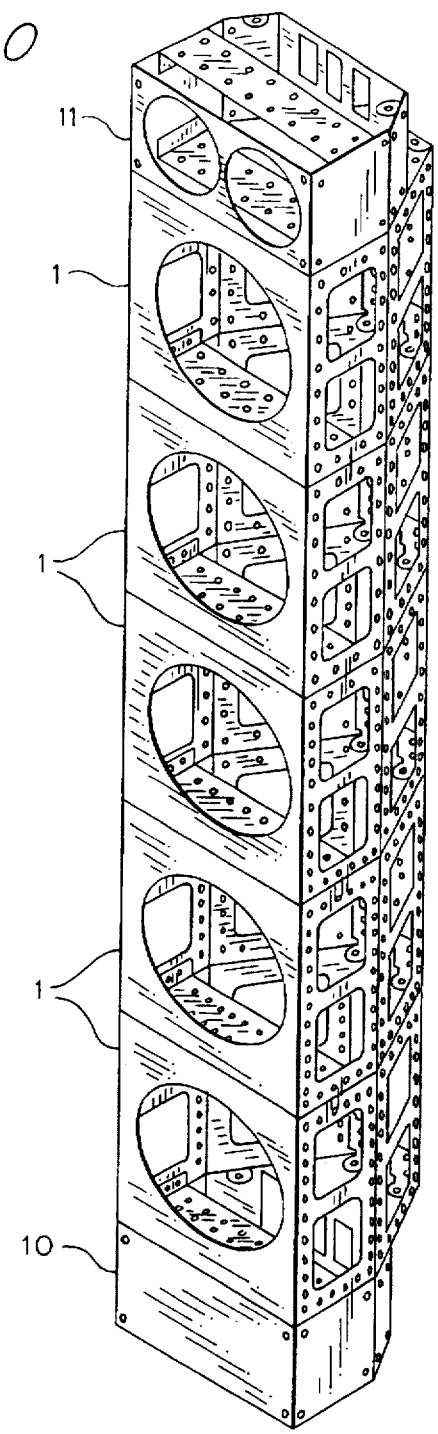
FIG. 10 is a perspective view of a linear modular support structure composed with the elements of FIGS. 2, 8 and 9.
Figure 11:
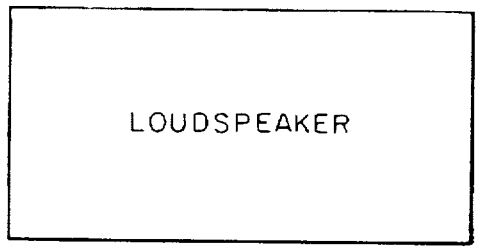

With reference to FIG. 10, elements 1 can also be mounted in line with one another, for example in a stacked relationship, connecting them by their stiffening faces 9 and perforated tabs 5 extending from oblique faces 7 or rear face 8, so that they form a substantially tubular, rectilinear, modular support structure. Advantageously, elements 10 and 11, illustrated respectively in FIGS. 8 and 9 and designed to contain auxiliary electronic instrumentation for lighting apparatuses or smaller apparatuses, can be mounted at the ends of such structure.

More precisely, element 10 has a main face 2 which is solid and of a rectangular form and, in addition to its parallel faces 6 and oblique faces 7, it has a rectangular rear face 8 with a window 12. Element 11 of FIG. 9 is very similar to element 10 of FIG. 8, but has a main face 2 with a pair of circular holes 3a and 3b, through which spotlights or loudspeakers can be visible.

The linear structure of FIG. 10 is, therefore, formed by a battery of support elements 1 for lighting apparatuses and by auxiliary support elements 10 and 11 situated at its ends. Clearly, elements 10 and 11 can also be inserted in any of the structures illustrated thus far as well as in all the other structures that can be obtained.

The faces of adjacent elements can advantageously be secured to one another by means of screws (not shown) of various types already existing on the market. To that end, as shown in the above-mentioned figures, the faces have perforations that are suited to correspond to the perforations of adjacent elements, in a number which can be varied according to the type of screws used. The perforations, furthermore, can function also as a support for fast locking power supply members, such as snap plugs (not shown).

Although, in the description and attached drawings, reference has been made to a modular support element with a main face and five connection faces, modular elements with a number of faces greater or lesser than five are considered as comprised in the scope of the invention. For example, an element with four connection faces would have a substantially pentagonal prismatic form, without a rear face, and would be suited for various combinations with other identical elements.

In conclusion, according to the invention, the support structure which can be obtained with the modular element described here accomplishes the preestablished objects since it is adaptable to a large number of applications, is self-supporting and makes it possible to realize compositions of various forms and arrangements to support lighting apparatuses and other electric or electronic devices with their relevant instrumentation.

Variations and/or modifications can be brought to the modular support structure and the modular support element according to the present invention without departing from the scope of the invention itself.

I claim:

1. For lighting apparatuses and other electric and electronic devices and their associated instrumentation, a modular support structure comprising:

a plurality of box-shaped modular elements (1) each having a main face (2) that is at least partly open and a series of consecutive faces (6, 7, 8) angled in succession and forming at least four connection surfaces, each connection surface configured to be attachable to a connection surface of an adjacent modular element;

wherein the consecutive faces extend consecutively from one side of the main face to the opposite side of the main face in an angled relationship between one face and the adjacent ones.

2. The modular support structure according to claim 1, wherein each of said modular support elements (1) is of a prismatic form and has the main face (2) and five consecutive faces (6, 7, 8) for connection with adjacent modular elements.

3. The modular support structure according to claim 1, further comprising lighting apparatuses and other electric and electronic devices and their associated instrumentation.

4. For lighting apparatuses and other electric and electronic devices and their associated instrumentation, a modular support element comprising:

a main face (2) and at least four connection faces (6, 7, 8), each connection face configured to be attachable to a connection face an adjacent modular element;

wherein the connection faces extend consecutively from one side of the main face to the opposite side of the main face in an angled relationship between one face and the adjacent ones.

5. The modular support element according to claim 4, wherein the element has a prismatic form and said consecutive connection faces are five.

6. The modular support element according to claim 5, wherein said connection faces comprise a first pair of faces (6) orthogonal to said main face (2), a second pair of faces (7) consecutive to said first pair of faces and angled with respect to them and a third face (8) which unites said two faces (7) of the second pair and is substantially parallel to said main face.

7. The modular support element according to claim 6, wherein the faces (6) of said first pair of faces are angled by about 150°, with respect of the faces (7) of said second pair of faces, whereas the faces (7) of the second pair are angled with the third face (8) by about 120°.

8. The modular support element according to claim 4, wherein said main face (2) has a pair of openings for access to lighting apparatuses, housed therein.

9. The modular support element according to claim 4, wherein stiffening faces (9) are provided orthogonal to said connection faces (6).

10. The modular support element according to claim 4, wherein said faces have perforations and tabs for connection as well as lightening windows.

11. The modular support element according to claim 4, further comprising lighting apparatuses and other electric and electronic devices and their associated instrumentation.

12. A modular support element having a prismatic shape with angled faces comprising:

(a) a main face (2) including an opening (3) for a wave-emitting device;
 (b) two parallel faces (9) each generally perpendicular to the main face (2), each of the parallel faces aligned with a first pair of opposite edges of the main face;
 (c) at least four connection faces, each configured to be attachable to a connection face of an adjacent modular element, two distinct ones of the connection faces being generally mutually parallel and being joined respectively with a second pair of opposite edges of the main face;
 at least one of the connection faces being non-perpendicular to another one of the connection faces;
 (d) means for connecting each of the connection faces.

13. The modular support element according to claim 12, wherein the means for connecting each of the connection faces includes a plurality of holes (13).

14. The modular support element according to claim 13, wherein the holes (13) are screw holes.

15. The modular support element according to claim 12, wherein the two parallel faces include the means for connecting, whereby a plurality of the modular supporting elements is stackable.

16. The modular support element according to claim 15, wherein the means for connecting each of the connection faces includes a plurality of holes (13).

17. The modular support element according to claim 16, wherein the holes (13) are screw holes.

18. The modular support element according to claim 12, further comprising a wave-emitting device which includes a light.

19. The modular support element according to claim 12, further comprising a wave-emitting device which includes a loudspeaker.

20. The modular support element according to claim 12, comprising means for mounting a wave-emitting device generally within the modular support element to emit through the opening.

\* \* \* \* \*